(12) United States Patent
Shindo et al.

(10) Patent No.: US 7,649,260 B2
(45) Date of Patent: Jan. 19, 2010

(54) SEMICONDUCTOR DEVICE

(75) Inventors: Akinori Shindo, Hokuto (JP);
Masatoshi Tagaki, Suwa (JP); Hideaki Kurita, Sakata (JP)

(73) Assignee: Seiko Epson Corporation (JP)

( * ) Notice: Subject to any disclaimer, the term of this patent is extended or adjusted under 35 U.S.C. 154(b) by 414 days.

(21) Appl. No.: 11/424,891

(22) Filed: Jun. 19, 2006

(65) Prior Publication Data

US 2007/0007599 A1 Jan. 11, 2007

(30) Foreign Application Priority Data

Jul. 6, 2005 (JP) ............................. 2005-197926
Mar. 17, 2006 (JP) ............................. 2006-074731

(51) Int. Cl.
*H01L 23/532* (2006.01)
(52) U.S. Cl. ..................... 257/758; 257/781; 257/784
(58) Field of Classification Search ................ 257/784, 257/781, 758
See application file for complete search history.

(56) References Cited

U.S. PATENT DOCUMENTS

| | | | |
|---|---|---|---|
| 5,084,752 A | 1/1992 | Satoh et al. | |
| 6,130,485 A | 10/2000 | Hirai | |
| 6,268,642 B1 | 7/2001 | Hsuan et al. | |
| 6,441,467 B2 | 8/2002 | Toyosawa et al. | |
| 6,465,895 B1 | 10/2002 | Park et al. | |
| 6,538,326 B2 | 3/2003 | Shimizu et al. | |
| 6,650,002 B1 | 11/2003 | Toyosawa et al. | |
| 6,864,562 B1 | 3/2005 | Toyosawa et al. | |
| 7,312,530 B2 | 12/2007 | Hashimoto et al. | |
| 2006/0097406 A1* | 5/2006 | Wu et al. .................... | 257/784 |
| 2007/0007599 A1 | 1/2007 | Shindo et al. | |
| 2007/0007662 A1 | 1/2007 | Shindo et al. | |

| | | |
|---|---|---|
| 2008/0284026 A1 | 11/2008 | Hashimoto et al. |

FOREIGN PATENT DOCUMENTS

| | | |
|---|---|---|
| CN | 1601735 | 9/2004 |
| JP | 11-126790 | 5/1999 |
| JP | 2001-110833 | 4/2001 |
| JP | 2002-319587 | 10/2002 |
| JP | 2003-179063 | 6/2003 |
| JP | 2004-207509 | 7/2004 |
| JP | 3608393 | 10/2004 |
| JP | 2004-363173 | 12/2004 |
| JP | 2005-050963 | 2/2005 |
| JP | 2005-108954 | 4/2005 |
| KR | 1997-0077390 | 12/1997 |
| KR | 1999-0052264 | 7/1999 |
| KR | 1999-0070614 | 9/1999 |

(Continued)

*Primary Examiner*—Michael B Shingleton
(74) *Attorney, Agent, or Firm*—Harness, Dickey & Pierce, P.L.C.

(57) ABSTRACT

A semiconductor device including: a semiconductor layer including an active region and an isolation region provided around the active region; an element formed in the active region; an interlayer dielectric formed above the semiconductor layer; and an electrode pad formed above the interlayer dielectric and having a rectangular planar shape having a short side and a long side, the electrode pad at least partially covering the element when viewed from a top side, and the semiconductor layer positioned in a specific range outward from a line extending vertically downward from the short side of the electrode pad being a forbidden region.

29 Claims, 3 Drawing Sheets

FOREIGN PATENT DOCUMENTS

| KR | 10-0302536 | 7/2001 |
| KR | 2001-0061082 | 7/2001 |
| KR | 2002-0030258 | 4/2002 |
| KR | 10-0419813 | 2/2004 |
| KR | 2007-0005498 | 1/2007 |
| KR | 2007-0005521 | 1/2007 |

\* cited by examiner

SEMICONDUCTOR DEVICE

Japanese Patent Application No. 2005-197926, filed on Jul. 6, 2005, and Japanese Patent Application No. 2006-74731, filed on Mar. 17, 2006, are hereby incorporated by reference in their entirety.

BACKGROUND OF THE INVENTION

The present invention relates to a semiconductor device.

In related-art technology, when disposing a semiconductor element such as a MOS transistor under a pad, the characteristics of the semiconductor element may be impaired due to stress during bonding. Therefore, the pad formation region and the semiconductor element formation region are separately provided in a semiconductor chip when viewed from the top side. However, since the semiconductor chip has been reduced in size and increased in degree of integration, disposition of the semiconductor element under the pad has been in demand. JP-A-2002-319587 discloses such technology, for example.

SUMMARY

According to a first aspect of the invention, there is provided a semiconductor device, comprising:

a semiconductor layer including an active region and an isolation region provided around the active region;

an element formed in the active region;

an interlayer dielectric formed above the semiconductor layer; and an electrode pad formed above the interlayer dielectric and having a rectangular planar shape having a short side and a long side, the electrode pad at least partially covering the element when viewed from a top side;

the semiconductor layer positioned in a specific range outward from a line extending vertically downward from the short side of the electrode pad being a forbidden region.

According to a second aspect of the invention, there is provided a semiconductor device, comprising:

a semiconductor layer including an active region and an isolation region provided around the active region;

an element formed in the active region;

an interlayer dielectric formed above the semiconductor layer; and an electrode pad formed above the interlayer dielectric and covering the element when viewed from a top side;

the semiconductor layer positioned within a specific range outward from a line extending vertically downward from an edge of the electrode pad being a forbidden region.

DETAILED DESCRIPTION OF THE EMBODIMENT

Figure 1:
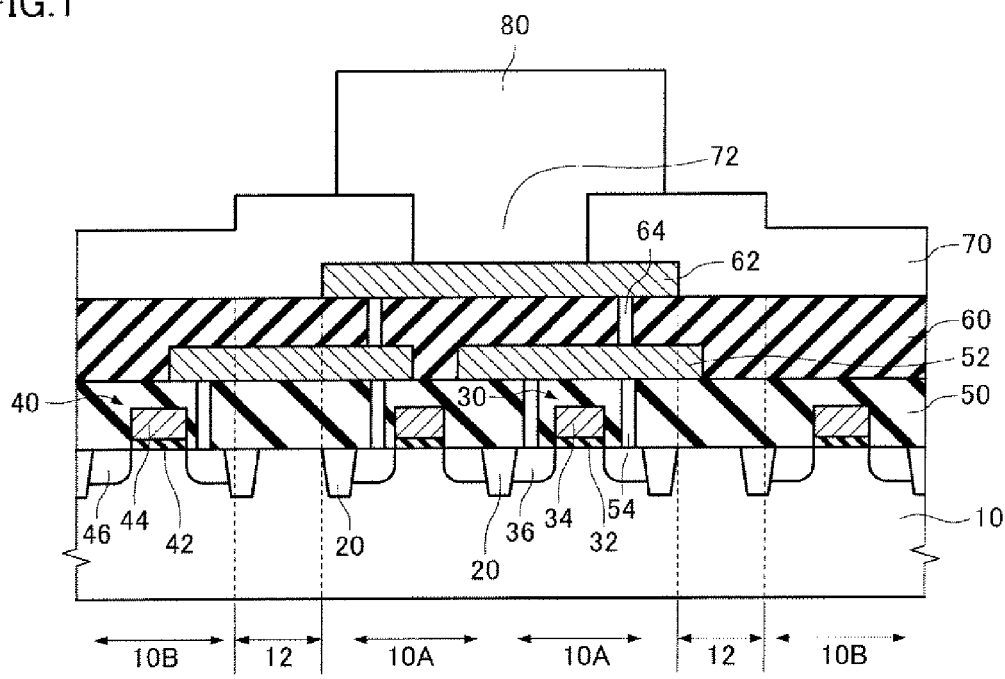
FIG. 1 is a view illustrative of a semiconductor device according to a first embodiment.

The invention may provide a highly reliable semiconductor device in which a semiconductor element can be formed under an electrode pad.

(1) According to one embodiment of the invention, there is provided a semiconductor device, comprising:

a semiconductor layer including an active region and an isolation region provided around the active region;

an element formed in the active region;

an interlayer dielectric formed above the semiconductor layer; and an electrode pad formed above the interlayer dielectric and having a rectangular planar shape having a short side and a long side, the electrode pad at least partially covering the element when viewed from a top side;

the semiconductor layer positioned in a specific range outward from a line extending vertically downward from the short side of the electrode pad being a forbidden region.

In the semiconductor device according to this embodiment, at least part of the semiconductor layer positioned under the electrode pad is the active region, and the forbidden region is provided in a specific region positioned outward from the short side of the electrode pad. In a specific region positioned outward from the short side of the electrode pad, stress tends to occur due to formation of the electrode pad. Therefore cracks tend to occur in the interlayer dielectric disposed above this region. For example, when a semiconductor element such as a MOS transistor is formed in this region, the characteristics of the MOS transistor may deteriorate. In the semiconductor device according to this embodiment, the above-described problem is eliminated by providing the forbidden region in this specific region. The active region is provided in the semiconductor layer positioned under the electrode pad, and a semiconductor element is disposed under the electrode pad at a position in which the semiconductor element can be formed without causing a problem. Specifically, this embodiment can provide a semiconductor device which is scaled down and provided with improved reliability by disposing a semiconductor element under the electrode pad at a position in which the reliability is not affected without disposing a semiconductor element at a position in which the reliability may be impaired.

In this embodiment, the active region means a region in which various elements such as a MIS transistor, diode and resistor are formed. In this embodiment, the statement "a specific layer B (hereinafter called "layer B") formed above a specific layer A (hereinafter called "layer A")" includes the case where the layer B is directly formed on the layer A and the case where the layer B is formed on the layer A through another layer.

The semiconductor device according to this embodiment may have the following features.

(2) In this semiconductor device, the forbidden region may be a range within 1.0 to 2.5 micrometers outward from the line vertically under the short side of the electrode pad.

(3) The semiconductor device may comprise:

a passivation layer formed above the electrode pad and having an opening which exposes at least part of the electrode pad, wherein the forbidden region is a range within a thickness of the passivation layer outward from the line vertically under the short side of the electrode pad.

(4) The semiconductor device may comprise a bump formed in the opening.

(5) According to one embodiment of the invention, there is provided a semiconductor device, comprising:

a semiconductor layer including an active region and an isolation region provided around the active region;

an element formed in the active region, an interlayer dielectric formed above the semiconductor layer; and an electrode pad formed above the interlayer dielectric and covering the element when viewed from a top side;

the semiconductor layer positioned within a specific range outward from a line extending vertically downward from an edge of the electrode pad being a forbidden region.

In the semiconductor device according to this embodiment, the semiconductor layer positioned under the electrode pad is the active region, and the forbidden region is provided in a specific region positioned outward from the edge of the electrode pad. Specifically, this embodiment has the same advantage as that of the above semiconductor device and can provide a semiconductor device which is scaled down and provided with improved reliability by disposing a semiconductor element under the electrode pad at a position in which the reliability is not affected without disposing a semiconductor element at a position in which the reliability may be impaired.

(6) In this semiconductor device, the forbidden region may be a range within 1.0 to 2.5 micrometers outward from the line vertically under the edge of the electrode pad.

(7) The semiconductor device may comprise:

a passivation layer formed above the electrode pad and having an opening which exposes at least part of the electrode pad, wherein the forbidden region is a range within a thickness of the passivation layer outward from the line vertically under the edge of the electrode pad.

(8) The semiconductor device may comprise a bump formed in the opening.

(9) In this semiconductor device, the element may be a transistor.

(10) In this semiconductor device, the forbidden region may be a forbidden region for a low-voltage-drive transistor.

(11) In this semiconductor device, a high-voltage transistor may be formed in the forbidden region.

Some embodiments of the invention will be described in detail below, with reference to the drawings.

1. First Embodiment

Figure 2:
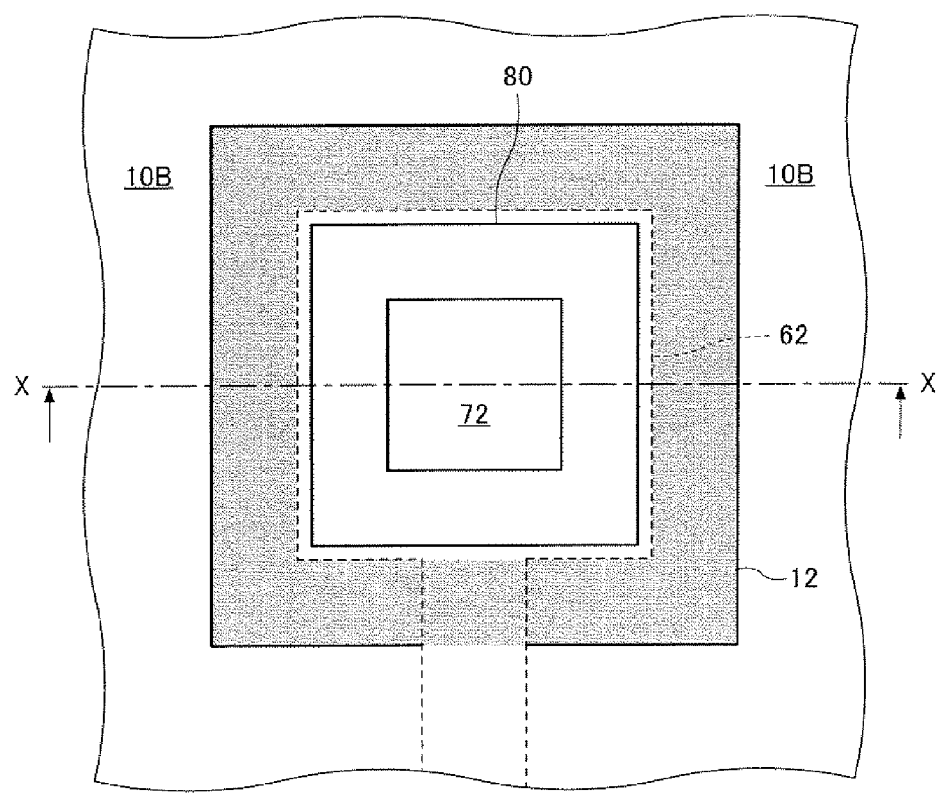
FIG. 2 is a view illustrative of the semiconductor device according to the first embodiment.
Figure 3:
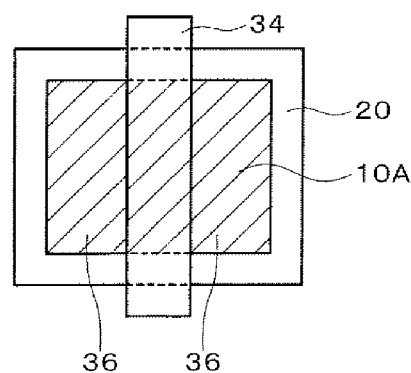
FIG. 3 is a view illustrative of the semiconductor device according to the first embodiment.

FIG. 1 is a cross-sectional view schematically showing a semiconductor device according to a first embodiment of the invention, and FIG. 2 is a plan view schematically showing the relationship between the shape of an electrode pad and a forbidden region in the semiconductor device according to the first embodiment. FIG. 3 is a plan view illustrative of an active region 10A. FIG. 1 shows the cross section along the line X-X shown in FIG. 2.

As shown in FIG. 1, the semiconductor device according to the first embodiment includes a semiconductor layer 10. As the semiconductor layer 10, a single crystal silicon substrate, a silicon on insulator (SOI) substrate in which a semiconductor layer is formed on an insulating layer, the semiconductor layer being a silicon layer, a germanium layer, or a silicon germanium layer, or the like may be used.

An isolation insulating layer 20 is formed in the semiconductor layer 10. The isolation insulating layer 20 may be formed by a shallow trench isolation (STI) method, a local oxidation of silicon (LOCOS) method, or a semi-recessed LOCOS method. FIG. 1 shows the isolation insulating layer 20 formed by the STI method. The active region 10A in which an element is formed and a forbidden region 12 are defined by forming the isolation insulating layer 20. The active region 10A is a region provided under an electrode pad, as described later. The forbidden region 12 is the gray area shown in FIG. 2, which is the semiconductor layer 10 in a specific range outside the edge of the electrode pad. The forbidden region 12 is also described later. In the semiconductor device according to the first embodiment, an active region 10B is provided outside the forbidden region 12.

A low-voltage-drive metal insulator semiconductor (MIS) transistor 30 in which an insulating layer is not formed in an offset region is formed in the active region 10A. An MIS transistor 40 is formed in the active region 10B in the same manner as in the active region 10A. The MIS transistor 30 includes a gate insulating layer 32, a gate electrode 34 formed on the gate insulating layer 32, and impurity regions 36 formed in the semiconductor layer 10. The impurity region 36 serves as a source region or a drain region. The MIS transistor 40 is a low-voltage-drive transistor which has a structure similar to that of the MIS transistor 30 and includes a gate insulating layer 42, a gate electrode 44, and impurity regions 46 and in which an insulating layer is not formed in an offset region. The active region 10A according to the first embodiment refers to a region enclosed by the isolation insulating layer 20 (region indicated by slanted lines) when viewed from the top side, as shown in FIG. 3. This also applies to the active region 10B.

An interlayer dielectric 50 which covers the MIS transistors 30 and 40 and an interlayer dielectric 60 are formed above the MIS transistors 30 and 40 in that order. The interlayer dielectric 50 and the interlayer dielectric 60 may be formed using a known material. An interconnect layer 52 having a specific pattern is formed on the interlayer dielectric 50. The interconnect layer 52 and the impurity region 36 of the MIS transistor 30 are electrically connected through a contact layer 54.

An electrode pad 62 is formed on the interlayer dielectric 60. The electrode pad 62 may be electrically connected with the interconnect layer 52 through a contact layer 64. The electrode pad 62 may be formed of a metal such as aluminum or copper.

As shown in FIG. 1, the semiconductor device according to the first embodiment further includes a passivation layer 70. An opening 72 which exposes at least part of the electrode pad 62 is formed in the passivation layer 70. As shown in FIGS. 1 and 2, the opening 72 may be formed to expose only the center region of the electrode pad 62. Specifically, the passivation layer 70 may be formed to cover the edge portion of the electrode pad 62. The passivation layer may be formed of $SiO_2$, SiN, a polyimide resin, or the like. In the semiconductor device according to the first embodiment, the term "electrode pad" refers to a region which includes the region in which the opening 72 is formed and has a width greater than that of the interconnect section.

In the semiconductor device according to the first embodiment, a bump 80 is formed at least in the opening 72. Specifically, the bump 80 is formed on the exposed surface of the electrode pad 62. In the semiconductor device according to the first embodiment shown in FIG. 1, the bump 80 is also formed on the passivation layer 70. The bump 80 may include one or more layers and may be formed of a metal such as gold, nickel, or copper. The external shape of the bump 80 is not particularly limited. The external shape of the bump 80 may be a quadrilateral (including square and rectangle) or a circle. The external shape of the bump 80 may cover less area than that of the electrode pad 62. In this case, the bump 80 may be formed only in the area in which the bump 80 overlaps the electrode pad 62.

A barrier layer (not shown) may be formed in the lowermost layer of the bump 80. The barrier layer prevents diffusion between the electrode pad 62 and the bump 80. The barrier layer may include one or more layers. The barrier layer may be formed by sputtering. The barrier layer may have a function of increasing the adhesion between the electrode pad 62 and the bump 80. The barrier layer may include a titanium tungsten (TiW) layer. When the barrier layer includes two or more layers, the outermost surface of the barrier layer may be an electroplating feed metal layer (e.g. Au layer) for depositing the bump 80.

The forbidden region 12 is described below. As described above, the forbidden region 12 refers to the region of the semiconductor layer 10 positioned within a specific range outward from the line vertically under the edge of the electrode pad 62. An active region cannot be disposed in the forbidden region 12.

The forbidden region 12 may be the range within the thickness of the passivation layer 70 outward (in the direction opposite to the opening 72) from the edge of the electrode pad 62. For example, the forbidden region 12 may be the range within 1.0 to 2.5 micrometers outward from the edge of the electrode pad 62. The range of the forbidden region 12 is specified as described above for the following reasons.

The formation of the electrode pad 62 causes stress to occur in the interlayer dielectric 60 at a position at which the edge of the electrode pad 62 is positioned. When the bump 80 is formed on the electrode pad 62, as shown in FIG. 1, a continuous stress is added due to the internal stress of the bump 80. The stress may cause cracks to occur in the interlayer dielectrics 50 and 60 from the position (edge of the electrode pad 62) at which the stress occurs. Such cracks may reach the lowermost layer of the interlayer dielectric, whereby the characteristics of the semiconductor element formed in such a region may be changed. For example, when an MIS transistor is formed in such a region, a gate insulating layer or the like deteriorates, whereby a leakage current flows.

The passivation layer 70 is not formed on a surface having a uniform height. That is, the passivation layer 70 may have a surface having a level difference corresponding to the shape of the electrode pad 62. For example, when mounting the semiconductor device by a chip-on-film (COF) method, stress tends to be concentrated on the level difference when connecting the bump 80 through a connection line (lead wire) formed on a film. This may also cause cracks to occur in the interlayer dielectrics 50 and 60. The level difference is generally formed in the area having a width approximately corresponding to the thickness of the passivation layer 70 outward from the edge of the electrode pad 62. The range of the forbidden region 12 is specified taking these problems into consideration.

In the semiconductor device according to the first embodiment, the semiconductor layer positioned under the electrode pad 62 is the active region 10A, and the forbidden region 12 is provided in a specific region outward from the edge of the electrode pad 62. Stress tends to occur in a specific region outward from the edge of the electrode pad 62. Therefore, cracks tend to occur in the interlayer dielectrics 50 and 60 disposed above the forbidden region 12. For example, when a semiconductor element such as a MOS transistor is formed in the forbidden region 12, the characteristics of the MOS transistor may deteriorate. In the semiconductor device according to the first embodiment, the above-described problem is eliminated by providing the forbidden region 12 in the above specific range. The semiconductor layer 10 positioned under the electrode pad 62 is provided as the active region 10A, and the semiconductor element is disposed under the electrode pad 62 at a position in which the semiconductor element can be formed without causing a problem. Specifically, the first embodiment can provide a semiconductor device which can be scaled down and maintains reliability by disposing the semiconductor element under the electrode pad at a position in which the reliability is not affected without disposing the semiconductor element at a position in which the reliability is impaired.

A conductive layer forming the gate electrode 34 may be used as an interconnect for connecting the semiconductor element with another element such as the MIS transistor 40. The portion of the conductive layer used as the interconnect may be formed in the forbidden region 12.

2. Second Embodiment

Figure 4:
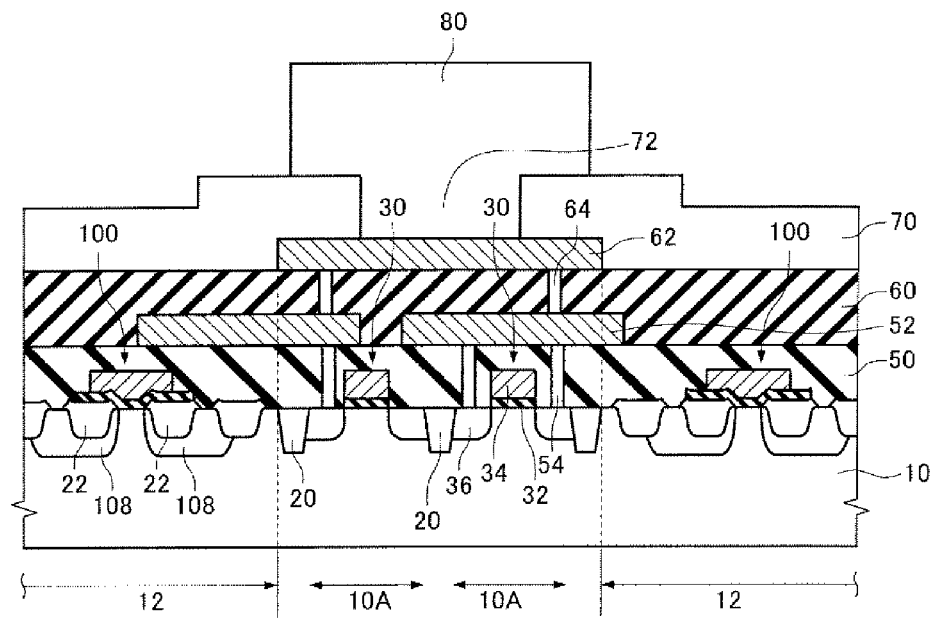
FIG. 4 is a view illustrative of a semiconductor device according to a second embodiment.

A second embodiment of the invention is described below with reference to FIG. 4. FIG. 4 is a cross-sectional view schematically showing a semiconductor device according to the second embodiment. The semiconductor device according to the second embodiment differs from the semiconductor device according to the first embodiment in that a semiconductor element is formed in the forbidden region 12. The following description merely illustrates the difference from the semiconductor device according to the first embodiment.

As shown in FIG. 4, the semiconductor device according to the second embodiment includes the active region 10A and the forbidden region 12 provided around the active region 10A. In the semiconductor device according to the second embodiment, the active region 10B is provided outside the forbidden region 12 in the same manner as in the semiconductor device according to the first embodiment, although not shown in FIG. 4.

In the semiconductor device according to the second embodiment, a high-voltage MOS transistor is formed in the forbidden region 12. In more detail, a MOS transistor 100 having a LOCOS offset structure is formed in the forbidden region 12. The MOS transistor 100 includes an offset insulating layer 22 which is formed in the semiconductor layer 10 and reduces an electric field, a gate insulating layer 102 formed on the semiconductor layer 10, a gate electrode 104 formed on part of the offset insulating layer 22 and the gate insulating layer 102, and impurity regions 106 formed in the semiconductor layer outside the gate electrode 104 and serving as either a source region or a drain region. An offset impurity region 108 of the same conductivity type as that of the impurity region 106 and having an impurity concentration lower than that of the impurity region 106 is formed under the offset insulating layer 22.

In the semiconductor device according to the second embodiment, some of the constituent elements of the MOS transistor 100 are formed in the semiconductor layer 10 in the forbidden region 12. In the MOS transistor 100, the end of the gate electrode 104 is formed on the offset insulating layer 22. Specifically, a structure in which the end of the gate electrode 104 (first conductive layer) is disposed on the semiconductor layer 10 through a thin insulating layer is not formed in the forbidden region 12. A problem which may occur when the MIS transistor 30 having the structure formed in the active region is formed in the forbidden region 12 is described below. The MIS transistor 30 has a structure in which the end of the gate electrode 34 is formed on the semiconductor layer 10, differing from the MOS transistor 100. Therefore, stress tends to occur in the semiconductor layer 10 at a position at which the end of the gate electrode 34 is positioned. As described in the first embodiment, cracks tend to occur in the interlayer dielectrics 50 and 60 positioned over the forbidden region 12, whereby the film tends to deteriorate. This effect may be exerted on the end of the gate electrode 34 at which stress occurs, whereby the gate insulating layer 32 may deteriorate. This may cause a leakage current to flow in the MIS transistor 30.

However, in the semiconductor device according to the second embodiment, since the end of the gate electrode 104 is disposed on the offset insulating layer 22 in the forbidden region 12, the above-described stress does not occur in the semiconductor layer 10, whereby deterioration of the gate insulating layer 102 can be prevented. This allows a semiconductor element having a specific structure to be disposed in the forbidden region 12 in addition to the active region 10A provided under the electrode pad 62, whereby the semiconductor chip can be further scaled down. This increases the number of semiconductor chips formed on one wafer, whereby the manufacturing cost can be reduced.

FIG. 4 illustrates the case where the MOS transistor 100 is formed in the forbidden region 12. Note that the second embodiment is not limited thereto. The second embodiment also includes the case where part of the configuration of the MOS transistor 100 is formed in the forbidden region 12. In this case, a MOS transistor having a one-sided offset structure may be formed.

3. Modification

Figure 5:
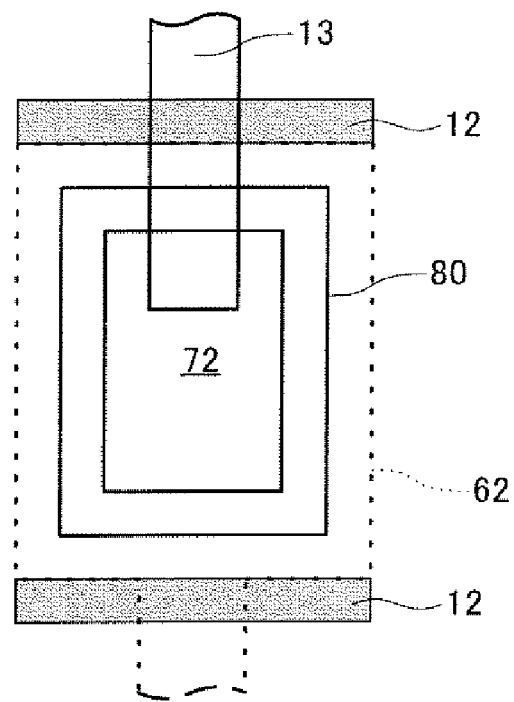
FIG. 5 is a view illustrative of the semiconductor device according to a modification of the first and second embodiments.

A modification of the semiconductor devices according to the first embodiment and the second embodiment is described below. This modification is characterized in that the bump 80 has a rectangular shape having a short side and a long side. FIG. 5 is a plan view schematically showing the positional relationship among the bump 80, the electrode pad 62, and the forbidden region 12. The following description merely illustrates the difference from the semiconductor devices according to the first embodiment and the second embodiment.

In the semiconductor device according to this modification, the bump 80 is formed in the opening 72 on the electrode pad 62, as shown in FIGS. 1 and 4. In this modification, the electrode pad 62 has a rectangular shape. The opening 72 is formed on part of the upper surface of the electrode pad 62, and the bump 80 is formed in the opening 72. The bump 80 has a pattern smaller than that of the electrode pad 62. As shown in FIG. 5, it is preferable that the bump 80 be provided inside the electrode pad 62 when viewed from the top side. In this modification, the forbidden region 12 is provided in the region positioned outward from the edge of the short side of the electrode pad 62. This configuration has the following advantage when mounting the semiconductor device by tape automated bonding (TAB) technology provided that the extension direction of a connection line 13 (lead wire) formed on a film made of a polyimide resin or the like is the direction along the long side of the electrode pad 62. In this case, the electrode pad 62 is pulled in the extension direction of the connection line, whereby stress occurs on the short side of the electrode pad 62. Therefore, cracks tend to occur in the interlayer dielectrics 50 and 60 on the edge of the short side of the electrode pad 62. This modification reliably prevents the semiconductor element from being formed at a position in which the reliability is decreased by providing the forbidden region 12 on the short side of the electrode pad 62. Moreover, since the forbidden region 12 is not provided in the semiconductor layer positioned under the long side of the electrode pad 62, the semiconductor element can be formed on the semiconductor layer positioned under the long side of the electrode pad 62, whereby a scaled-down semiconductor device can be provided.

Figure 6:
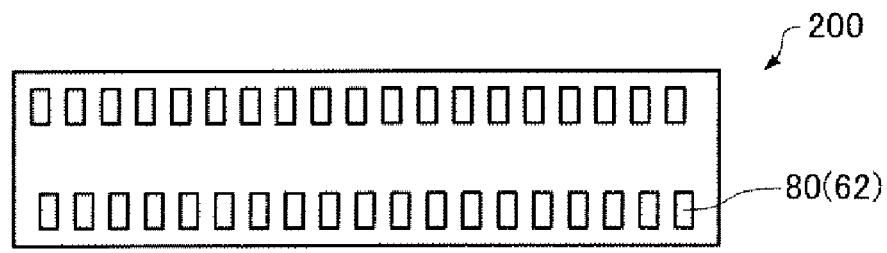
FIG. 6 is a view illustrative of the semiconductor device according to a modification of the first and second embodiments.

In particular, in a semiconductor chip 200 which is scaled down as shown in FIG. 6, a structure may be required in which the opening 72 and the bump 80 are formed in a rectangular shape to provide a number of openings 72. According to this modification, a semiconductor device which is scaled down and provided with improved reliability can be provided by providing the forbidden region 12 in an appropriate region in a semiconductor device having such rectangular electrode pads 62 (bumps 80).

The above embodiments illustrate the case where two interlayer dielectrics 50 and 60 are provided and one interconnect layer 52 is provided between the interlayer dielectrics 50 and 60. Note that the above embodiments are not limited thereto. A structure may also be employed in which three or more interlayer dielectrics are stacked and interconnect layers in a number corresponding to the number of interlayer dielectrics are provided.

The invention is not limited to the above-described embodiments, and various modifications can be made. For example, the invention includes various other configurations substantially the same as the configurations described in the embodiments (in function, method and result, or in objective and result, for example). The invention also includes a configuration in which an unsubstantial portion in the described embodiments is replaced. The invention also includes a configuration having the same effects as the configurations described in the embodiments, or a configuration able to achieve the same objective. Further, the invention includes a configuration in which a publicly known technique is added to the configurations in the embodiments.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention.

What is claimed is:

1. A semiconductor device, comprising:
   a substrate, the substrate including:
   a first region including a first high breakdown voltage transistor;
   a second region including a second high breakdown voltage transistor; and
   a third region located between the first region and the second region, the third region including a third transistor,
   an interlayer dielectric layer located above the first high breakdown voltage transistor, the second high breakdown voltage transistor and the third transistor; and
   an electrode pad located above the interlayer dielectric layer and overlapping the third transistor;
   the electrode pad having a first edge and a second edge, the second edge being opposed to the first edge,
   the first region having a range within 2.5 micrometers outward from a first line located directly below the first edge, and
   the second region having a range within 2.5 micrometers outward from a second line located directly below the second edge.

2. The semiconductor device according to claim 1 further comprising a passivation layer including an opening, the opening being located above the electrode pad.

3. The semiconductor device according to claim 2 further comprising a bump located in the opening.

4. The semiconductor device according to claim 1, the third region being located inward from the first line and the second line.

5. The semiconductor device according to claim 1,
all of the first high breakdown voltage transistor being located completely in the first region, and
all of the second high breakdown voltage transistor being located completely in the second region.

6. The semiconductor device according to claim 5, all of the third transistor being located completely in the third region.

7. The semiconductor device according to claim 5, a part of the third transistor being located in the third region.

8. The semiconductor device according to claim 1,
a part of the first high breakdown voltage transistor being located in the first region, and
a part of the second high breakdown voltage transistor being located in the second region.

9. The semiconductor device according to claim 8, all of the third transistor being located completely in the third region.

10. The semiconductor device according to claim 8, a part of the third transistor being located in the third region.

11. The semiconductor device according to claim 1,
a part of the first high breakdown voltage transistor being located in the first region, and
all of the second high breakdown voltage transistor being located completely in the second region.

12. The semiconductor device according to claim 11, all of the third transistor being located completely in the third region.

13. The semiconductor device according to claim 11, a part of the third transistor being located in the third region.

14. The semiconductor device according to claim 1,
a first gate electrode of the first high breakdown voltage transistor being located in the first region, and
the second gate electrode of the second high breakdown voltage transistor being located in the second region.

15. A semiconductor device, comprising:
a substrate, the substrate including:
a first region including a first transistor, the first transistor including a first gate electrode and a first offset insulating layer, an edge of the first gate electrode being located above the first offset insulating layer;
a second region including a second transistor, the second transistor including a second gate electrode and a second offset insulating layer, an edge of the second gate electrode being located above the second insulating layer, and
a third region located between the first region and the second region, the third region including a third transistor,
an interlayer dielectric layer located above the first transistor, the second transistor and the third transistor; and
an electrode pad located above the interlayer dielectric layer and overlapping the third transistor,
the electrode pad having a first edge and a second edge, the second edge being opposed to the first edge,
the first region having a range within 2.5 micrometers outward from a first line located directly below the first edge, and
the second region having a range within 2.5 micrometers outward from a second line located directly below the second edge.

16. The semiconductor device according to claim 15 further comprising a passivation layer including an opening, the opening being located above the electrode pad.

17. The semiconductor device according to claim 16 further comprising a bump located in the opening.

18. The semiconductor device according to claim 15,
the first offset insulating layer being a first LOCOS, and
the second offset insulating layer being a second LOCOS.

19. The semiconductor device according to claim 15, the third region being located inward from the first line and the second line.

20. The semiconductor device according to claim 15,
all of the first high breakdown voltage transistor being located completely in the first region, and
all of the second high breakdown voltage transistor being located completely in the second region.

21. The semiconductor device according to claim 20, all of the third transistor being located completely in the third region.

22. The semiconductor device according to claim 20, a part of the third transistor being located in the third region.

23. The semiconductor device according to claim 15,
a part of the first high breakdown voltage transistor being located in the first region, and
a part of the second high breakdown voltage transistor being located in the second region.

24. The semiconductor device according to claim 23, all of the third transistor being located completely in the third region.

25. The semiconductor device according to claim 23, a part of the third transistor being located in the third region.

26. The semiconductor device according to claim 15,
a part of the first high breakdown voltage transistor being located in the first region, and
all of the second high breakdown voltage transistor being located completely in the second region.

27. The semiconductor device according to claim 26, all of the third transistor being located completely in the third region.

28. The semiconductor device according to claim 26, a part of the third transistor being located in the third region.

29. The semiconductor device according to claim 15,
the first gate electrode being located in the first region, and
the second gate electrode being located in the second region.

* * * * *